(12) United States Patent
Ko

(10) Patent No.: US 8,437,986 B2
(45) Date of Patent: May 7, 2013

(54) METHOD FOR DETECTING AND FILTERING A RANDOM NOISE SIGNAL

(75) Inventor: Byoung gwan Ko, Seoul (KR)

(73) Assignee: Soonhan Engineering Corp., Kyungki-Do (KR)

( * ) Notice: Subject to any disclaimer, the term of this patent is extended or adjusted under 35 U.S.C. 154(b) by 229 days.

(21) Appl. No.: 12/844,394

(22) Filed: Jul. 27, 2010

(65) Prior Publication Data

US 2011/0066403 A1    Mar. 17, 2011

(30) Foreign Application Priority Data

Sep. 14, 2009    (KR) .................. 10-2009-0086545

(51) Int. Cl.
*H03F 1/26* (2006.01)
(52) U.S. Cl.
USPC ........................................... 702/191

(58) Field of Classification Search .................. 702/191, 702/182–185
See application file for complete search history.

(56) References Cited

U.S. PATENT DOCUMENTS

2012/0203467 A1* 8/2012 Kamath et al. .................. 702/19

* cited by examiner

*Primary Examiner* — Edward Raymond
(74) *Attorney, Agent, or Firm* — Kenyon & Kenyon LLP

(57) ABSTRACT

A random noise signal detecting and filtering method includes: (a) calculating a difference value of data currently being input from a sensor in comparison with previous data stored in a register; (b) comparing the calculated difference value with a critical value; (c) determining whether the calculated difference value is greater than a maximum critical value or less than a minimum critical value; and (d) if the calculated difference value is greater than the maximum critical value or less than the minimum critical value, determining the current data be constitute a random signal and substituting the previous data for the current data.

12 Claims, 5 Drawing Sheets

METHOD FOR DETECTING AND FILTERING A RANDOM NOISE SIGNAL

CROSS-REFERENCE TO RELATED APPLICATIONS

The present application claims priority to Application No. 10-2009-0086545, filed in the Republic of Korea on Sep. 14, 2009, which is expressly incorporated herein in its entirety by reference thereto.

FIELD OF THE INVENTION

The present invention relates to a method for detecting and filtering a random noise signal.

BACKGROUND INFORMATION

Generally speaking, a variety of types of sensors exist according to their purpose in measuring length, weight, speed, acceleration, temperature, pressure, etc.

In addition, data that is measured by a sensor may be used in the monitoring and analysis of conditions at a subject plant, and may also used in automated industrial work to control other systems in real-time by sensor signals that are output.

Ordinarily speaking, most concurrently inflowing noise signals from a sensor have a prescribed cycle; noise signals with such prescribed cycle may use a filter involving a conventional filtering method such as a low pass filter, high pass filter, or band filter. However, depending on the surrounding environment used by the sensor, the inflow of noise signals without a specific cycle may sometimes occur together with noise signals of a prescribed cycle.

If the sensor signals that are measured at such time are distorted by a specific noise, then incorrect interpretation or control may be conducted, which may cause problems with product quality or productivity.

In particular, processing methods are extremely difficult to use with noise signals without a prescribed form or cycle, and an inordinate amount of time is required in order to process such signals; consequently, they are even more problematic in production work where real-time control is required.

SUMMARY

Example embodiments of the present invention provide a random noise signal detecting and filtering method in which, in the event that the analyzed results of analyzed signals that were measured through the use of a general analog signal-outputting sensor fall outside of a predetermined critical value, they are interpreted as random signals and are filtered, thereby rendering possible precise monitoring and condition analysis.

According to example embodiments of the present invention, a random noise signal detecting and filtering method include: calculating the difference value (speed) of data currently being input from a sensor in comparison with previous data stored in a register; comparing the above calculated results with a critical value; making a comparison as to whether the compared results are greater than the maximum critical value or less than the minimum critical value; and, if the compared results are greater than the maximum critical value or less than the minimum critical value, regulating the results as a random signal and the substituting the previous data with the current data.

According to example embodiments of the present invention, a random noise signal detecting and filtering method according includes: calculating the difference value (speed) of data currently being input from a sensor in comparison with previous data stored in a register; comparing the above calculated results with a critical value; making a comparison as to whether the compared results are greater than the maximum critical value or less than the minimum critical value; if the compared results are greater than the maximum critical value or less than the minimum critical value, prescribing the above signal, repeating the previous steps, calculating the mean value from the acquired data and storing the mean value in the register; and entering the mean value stored in the register as the data (N) value of {Formula 1} below, discarding data (1) while the average of the N unit data is again calculated, replacing the mean value previously stored in the specific memory or buffer, and calculating the speed the next time.

With the random noise signal detecting and filtering method according to example embodiments of the present invention, precise monitoring and condition analysis of the target system is made possible through detailed signal measurement, and defects/errors may be reduced to enhance product productivity and quality. Furthermore, the calculation time used in filtering may be reduced through simplification of the method. As a result, the method may be applied in locations that require real-time control, such as with FPD or equipment for examining semiconductors. In addition, when applying such method in real-time control, the malfunctions and errors of equipment due to random noise signals may be prevented, and product productivity may be enhanced.

According to an example embodiment of the present invention, a random noise signal detecting and filtering method includes: (a) calculating a difference value of data currently being input from a sensor in comparison with previous data stored in a register; (b) comparing the calculated difference value with a critical value; (c) determining whether the calculated difference value is greater than a maximum critical value or less than a minimum critical value; and (d) if the calculated difference value is greater than the maximum critical value or less than the minimum critical value, determining the current data be constitute a random signal and substituting the previous data for the current data.

According to an example embodiment of the present invention, a random noise signal detecting and filtering method includes: (a) calculating a difference value of data currently being input from a sensor in comparison with previous data stored in a register; (b) comparing the calculated difference value with a critical value; (c) determining whether the calculated difference value is greater than a maximum critical value or less than a minimum critical value; (d) if the calculated difference value is greater than the maximum critical value or less than the minimum critical value: (i) prescribing the current data; (ii) repeating the calculating (a), the comparing (b), and the determining (c); and (iii) calculating a mean value from the acquired data and storing the mean value in the register; and (e) entering the mean value stored in the register as Data(N) of the formula:

$$\text{Mean value} = \{\text{Data}(1) + \text{Data2} +, \ldots, \text{Data}(N)\}/N,$$

discarding Data(1) in the formula, recalculating the mean value of the N-unit data, replacing the mean value previously stored in the register with the recalculated mean value, and using the recalculated mean value in subsequent calculation of the difference value.

The difference value may represent a speed of data currently being input from the sensor in comparison with the previous data stored in the register.

In the calculating (a) of the difference value, a mean value of the data currently being input from the sensor may be used at a predetermined frequency of the previous data stored in the register.

The speed may be calculated as a predetermined standard constant value in place of the previous data stored in the register.

The substituting may include replacing the current data with the previous data.

The substituting may include replacing the current input data with a predetermined standard constant value.

Further features and aspects of example embodiments of the present invention are described in more detail below with reference to the appended Figures.

DETAILED DESCRIPTION

Figure 1:
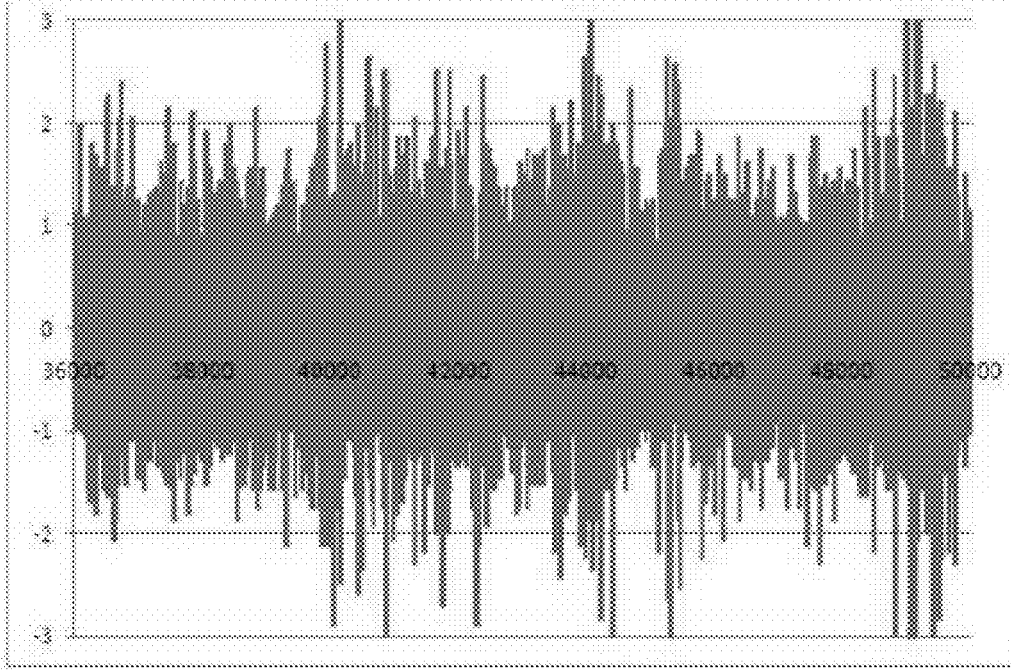
FIG. 1 illustrates the per hour speed calculation results per sampling relative to the inflow of random signals together with normal signals.

FIG. 1 is a diagram of the per hour speed calculation results per sampling relative to the inflow of random signals together with normal signals. In referring to FIG. 1, the division between random and normal signals is obscured, and the difficulty in detecting irregular signals is recognizable. These results are a result of high frequency noise; such high frequency noise accepts various output sensor signals, and through calculating the mean value (representative value) of accepted data, such noise may be eliminated.

Accordingly, example embodiments of the present invention address these problems. One purpose of the random noise signal detecting and filtering method is to obtain the desired signals by appropriately filtering noise signals that inflow together with sensor signals at the time that sensor signals are measured when a general-use analog signal output form of sensor is utilized.

The random noise signal detecting and filtering method according to example embodiments of the present invention include: calculating the difference value (speed) of data currently being input from a sensor in comparison with previous data stored in a register; comparing the above calculated results with a critical value; determining whether the compared results are greater than the maximum critical value or less than the minimum critical value; and, if the compared results are greater than the maximum critical value or less than the minimum critical value, regulating the results as a random signal and substituting the previous data with the current data.

Moreover, the random noise signal detecting and filtering method according to example embodiments of the present invention includes: calculating the difference value (speed) of data currently being input from a sensor in comparison with previous data stored in a register; comparing the above calculated results with a critical value; determining whether the compared results are greater than the maximum critical value or less than the minimum critical value; if the compared results are greater than the maximum critical value or less than the minimum critical value, prescribing the above signal, repeating the foregoing steps, calculating the mean value from the acquired data, and storing the mean value in the register; and entering the mean value stored in the register as the data (N) value of {Formula 1} below, discarding data (1) while the average of the N unit data is again calculated, replacing the mean value previously in a specific memory or buffer therewith, and using it to calculate the speed the next time:

$$\text{Mean value} = \{Data(1) + Data2+, \ldots, Data(N)\}/N \quad \{1\}$$

Furthermore, in the calculation of the difference value (speed) of data currently being input from a sensor in comparison with previous data stored in a register, the mean value of the data currently being input from the sensor is used at the predetermined frequency of the previous data stored in the register.

In addition, in the determination as to whether the compared results are greater than the maximum critical value or less than the minimum critical value, if the compared results are greater than the maximum critical value or less than the minimum critical value, the currently input data is replaced by the previous data or predetermined data.

As stated above, the random noise signal detecting and filtering method according to example embodiments of the present invention is capable of obtaining the following effects.

First, precise monitoring and condition analysis of the target system is made possible through detailed signal measurement, and defects/errors may be reduced to enhance product productivity and quality.

Second, the calculation time required in filtering may be reduced through simplification of the method; as a result, the method may be applied in locations that require real-time control, such as with FPD or equipment for examining semiconductors.

Third, when applying such method in real-time control, the malfunctions and errors of equipment due to random noise signals may be prevented, and product productivity may be enhanced.

The random noise signal detecting and filtering method according to example embodiments of present invention is described in greater detail below.

When explaining the random signal detection process according to example embodiments of the present invention by referring FIGS. 2 to 4b, in the event that random noise signals are included in the output of the analog output form of sensor, the method involves detecting and eliminating such random signals.

In general, random signals do not possess a prescribed cycle (audio frequency) or size (amplitude). Consequently, such random signals have been undetectable in conventional filtering methods. Ordinarily, such random signals occur in a sudden hunting (popping) signal form, and such hunting signals have a more rapid slope and size than signals that are normally input.

For example, this means that the signals currently being input are abruptly larger or smaller than signals that were input in the past. Consequently, as provided by the random signal detection process, in the event that that the difference (speed) between signals currently being input and signals that were input in the past is calculated and this calculated value is larger than a predetermined critical value, the signals currently being input are ignored and the input of the next signal is received again.

However, in an environment in which the inflow of many high frequency noise signals is occurring, there are no major differences in such speed fluctuation rates between normal signals and random signals. Consequently, in order to apply the method, the processing of high frequency noise relative to signals that were input in the past must preliminarily occur in order to calculate the speed. With high frequency noise, two or more measured signals are averaged by the use of the {formula 1} to produce the solution.

Such calculated mean values (representative values) are stored in specific memory or a buffer, and are used to represent past signals.

For example, after one unit of data has been received, a mean value that has been previously calculated and stored is read and the difference between the two units of data is calculated as noted in {Formula 2}, thereby calculating the speed:

$$\text{speed} = (\text{data}(N) - \text{mean value}) / \text{sampling time} \quad \{2\}$$

Figure 4A:
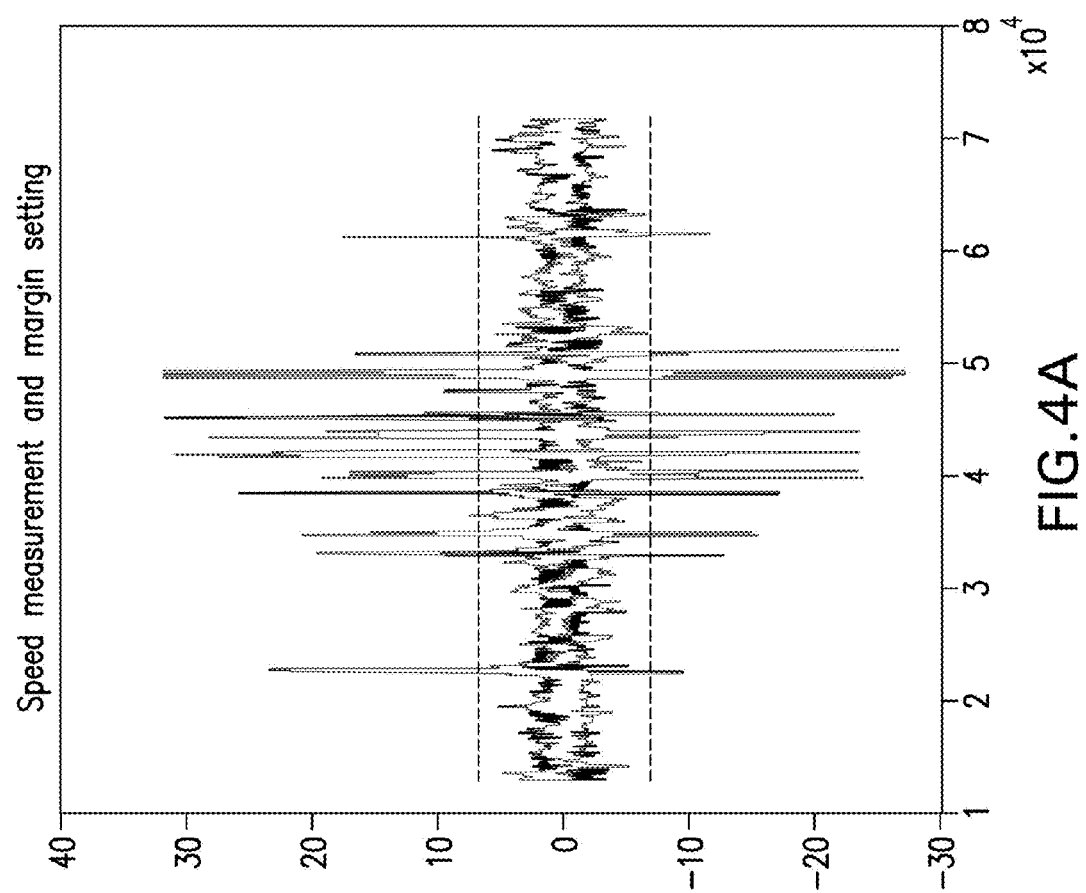
FIGS. 4a and 4b illustrate the filtering of random signals according to an example embodiment of the present invention.
Figure 4B:
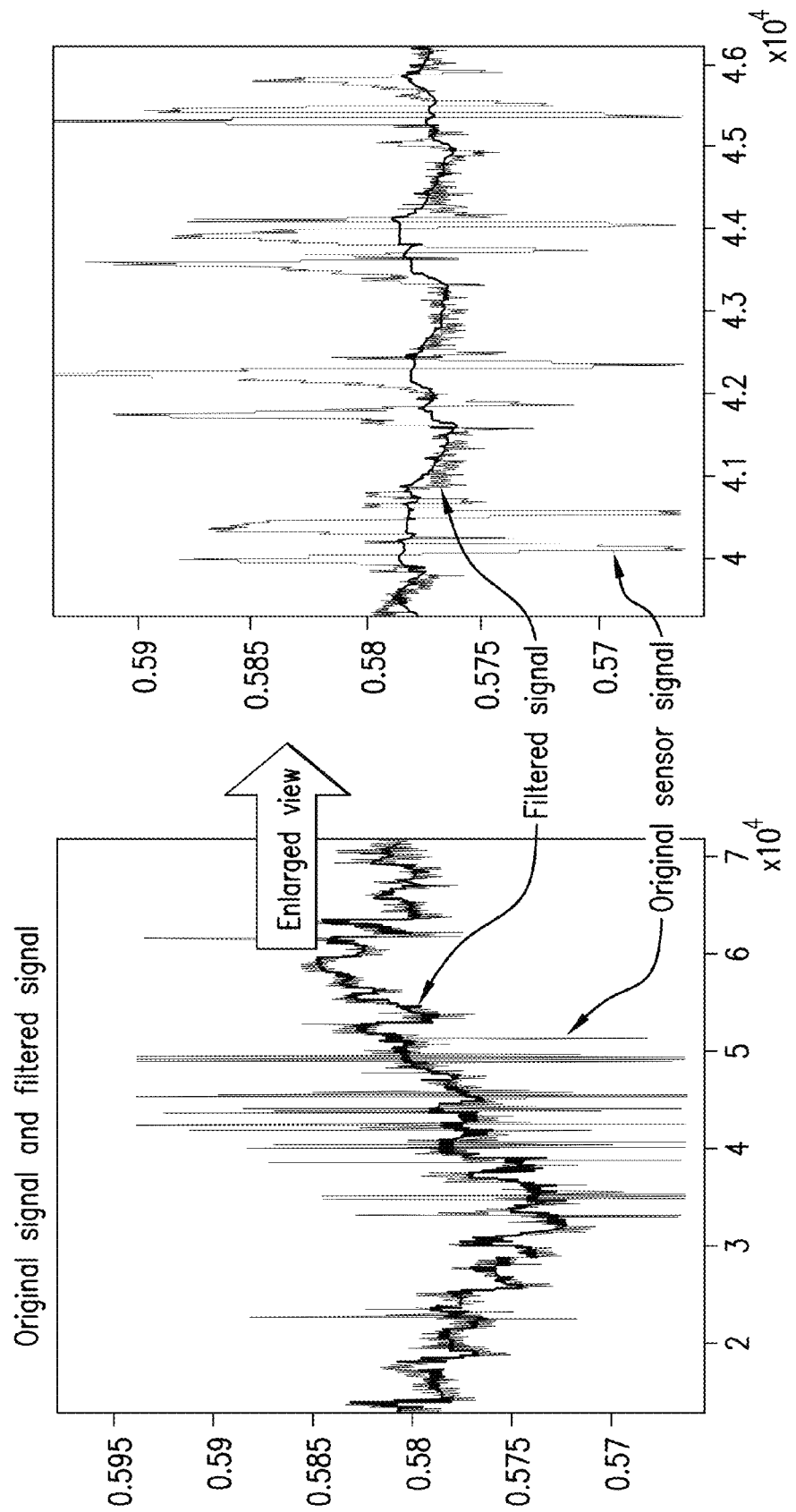

The results of applying the filtering method explained above are shown in FIGS. 4a and 4b. In FIGS. 4a and 4b, the results from prior to applying the filtering method and subsequent to pre-calculating the speed value, the results of applying the filtering method following the establishment of an appropriate speed margin (for example, 7 mm/s), and the filtering in which the calculated macroscopic sensor signal only remains and the instantaneously hunted signal is filtered are illustrated.

The remaining filtered signal is entered as the data (N) value of {formula 1}, data (1) is eliminated, and the average of N data is again calculated; this is used to replace the mean value previously stored in specific memory or buffer, and is used to calculate the speed the next time.

Figure 2:
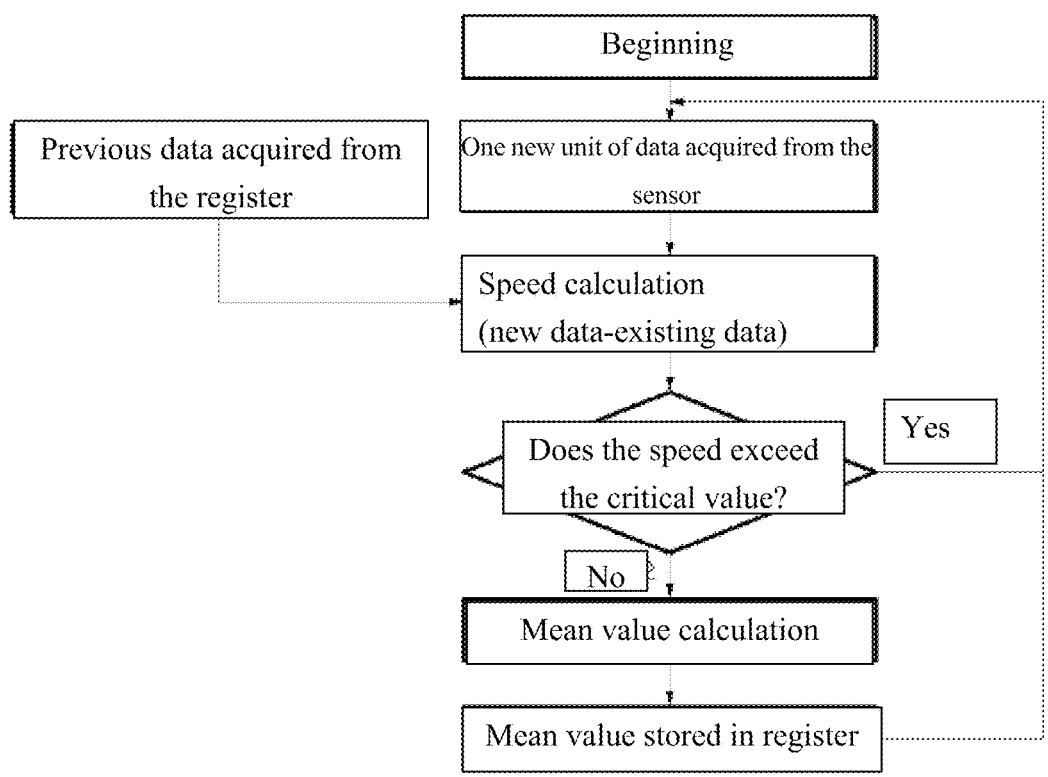
FIG. 2 is a flow chart illustrating the random signal detection process according to an example embodiment of the present invention.
Figure 3:
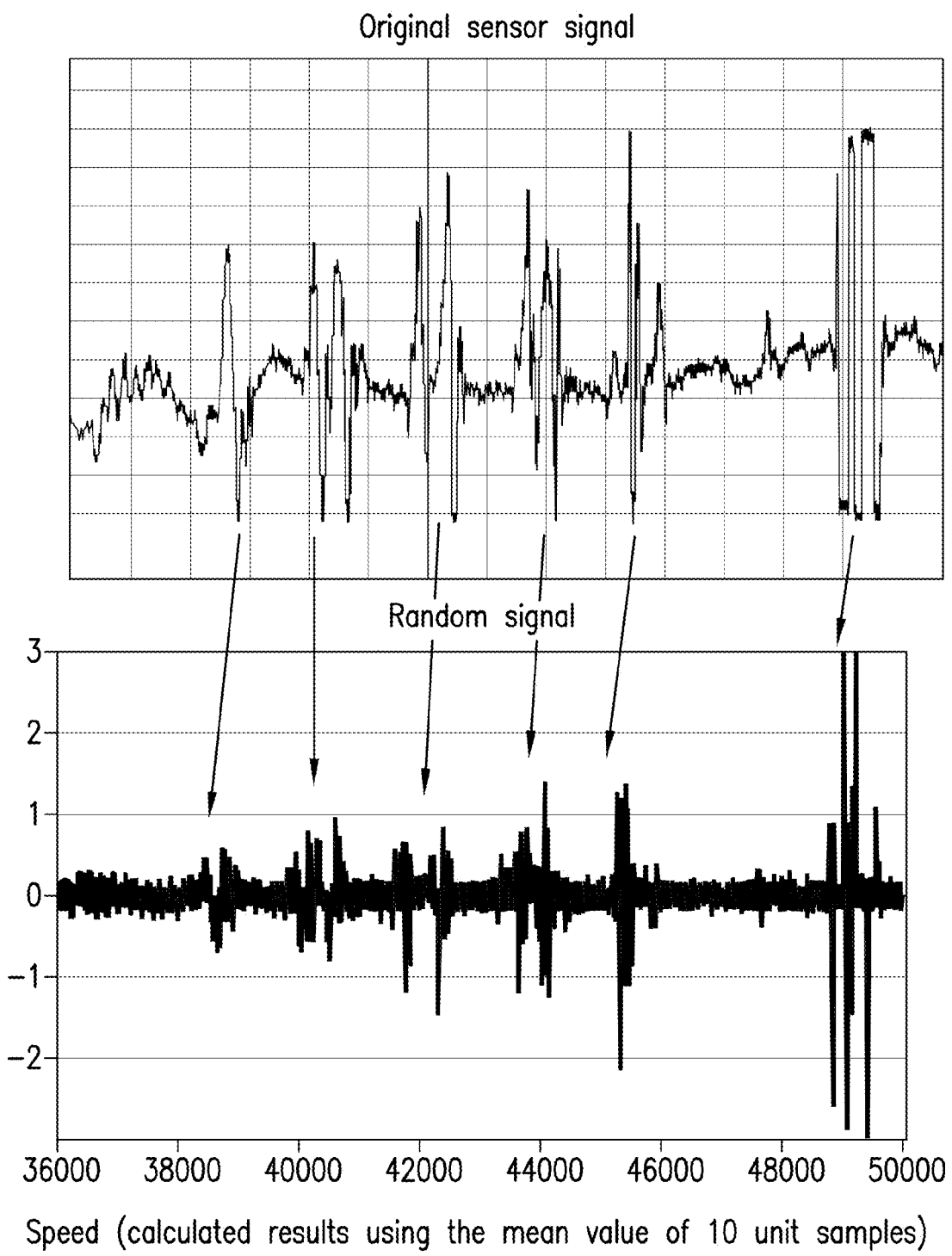
FIG. 3 illustrates the calculation of the difference value for detecting random signals according to an example embodiment of the present invention.

By reference to the flow chart depicting the random signal detection process illustrated in FIG. 2, a more detailed explanation is provided of the method of detecting and removing random signals, in the event that such random signals are included in the output of an analog form of sensor.

First, if one new unit of data is acquired from the output of an analog form of sensor, this is compared with data that has been previously recorded within a register. Subsequently, the previous data is subtracted from the new data, and the speed is calculated. Therefore, if the calculated speed exceeds the critical value, the new data is eliminated, a single signal is again acquired from the sensor, and the previous process is repeated. In the event that the calculated speed does not exceed the critical value, the mean value is calculated while this process is repeated. Thereafter, the mean value calculated in this manner is stored in the register. As a result, random signals are all filtered by this process as it is repeated.

As previously described with respect to signals that are filtered and are left remaining, these are entered as the data (N) value of {formula 1}, data (1) is discarded while the average of the N unit data is again calculated, this replaces the mean value previously stored in specific memory or buffer, and is used to calculate the speed the next time.

The method as described above has been explained based on certain example embodiments, but these example embodiments are not intended to be restrictive but are rather used for the purpose of illustration.

What is claimed is:

1. A random noise signal detecting and filtering method, comprising:
   (a) calculating a difference value of data currently being input from a sensor in comparison with previous data stored in a register;
   (b) comparing the calculated difference value with a critical value;
   (c) determining whether the calculated difference value is greater than a maximum critical value or less than a minimum critical value; and
   (d) if the calculated difference value is greater than the maximum critical value or less than the minimum critical value, determining the current data to constitute a random signal and substituting the previous data for the current data.

2. The method according to claim 1, wherein the difference value represents a speed of data currently being input from the sensor in comparison with the previous data stored in the register.

3. The method according to claim 1, wherein, in the calculating (a) of the difference value, a mean value of the data currently being input from the sensor is used at a predetermined frequency of the previous data stored in the register.

4. The method according to claim 2, wherein the speed is calculated as a predetermined standard constant value in place of the previous data stored in the register.

5. The method according to claim 1, wherein the substituting includes replacing the current data with the previous data.

6. The method according to claim 1, wherein the substituting includes replacing the current input data with a predetermined standard constant value.

7. A random noise signal detecting and filtering method, comprising:
   (a) calculating a difference value of data currently being input from a sensor in comparison with previous data stored in a register;
   (b) comparing the calculated difference value with a critical value;
   (c) determining whether the calculated difference value is greater than a maximum critical value or less than a minimum critical value;
   (d) if the calculated difference value is greater than the maximum critical value or less than the minimum critical value:
      (i) prescribing the current data;
      (ii) repeating the calculating (a), the comparing (b), and the determining (c); and
      (iii) calculating a mean value from the acquired data and storing the mean value in the register; and
   (e) entering the mean value stored in the register as Data(N) of the formula:

$$\text{Mean value} = \{\text{Data}(1) + \text{Data}2 +, \ldots, \text{Data}(N)\}/N,$$

discarding Data(1) in the formula, recalculating the mean value of the N-unit data, replacing the mean value previously stored in the register with the recalculated mean value, and using the recalculated mean value in subsequent calculation of the difference value.

8. The method according to claim 7, wherein the difference value represents a speed of data currently being input from the sensor in comparison with the previous data stored in the register.

9. The method according to claim 7, wherein, in the calculating (a) of the difference value, a mean value of the data currently being input from the sensor is used at a predetermined frequency of the previous data stored in the register.

10. The method according to claim 8, wherein the speed is calculated as a predetermined standard constant value in place of the previous data stored in the register.

11. The method according to claim 7, further comprising replacing the current data with the previous data if the calculated difference value is greater than the maximum critical value or less than the minimum critical value.

12. The method according to claim 7, further comprising replacing the current input data with a predetermined standard constant value if the calculated difference value is greater than the maximum critical value or less than the minimum critical value.

* * * * *